(12) United States Patent
Hashimoto et al.

(10) Patent No.: US 12,733,429 B2
(45) Date of Patent: Sep. 8, 2026

(54) PLUG, METHOD OF MANUFACTURING PLUG, AND MEMBER FOR SEMICONDUCTOR MANUFACTURING APPARATUS

(71) Applicant: NGK INSULATORS, LTD., Nagoya-City (JP)

(72) Inventors: Hideaki Hashimoto, Nisshin (JP); Masashi Ono, Nagoya (JP); Michihiro Ashida, Nagoya (JP)

(73) Assignee: NGK INSULATORS, LTD., Nagoya-City (JP)

( * ) Notice: Subject to any disclaimer, the term of this patent is extended or adjusted under 35 U.S.C. 154(b) by 437 days.

(21) Appl. No.: 18/520,954

(22) Filed: Nov. 28, 2023

(65) Prior Publication Data

US 2024/0213052 A1 Jun. 27, 2024

(30) Foreign Application Priority Data

Dec. 21, 2022 (JP) ................................ 2022-203899

(51) Int. Cl.

| | |
|---|---|
| ***H10P 72/00*** | (2026.01) |
| ***B28B 1/14*** | (2006.01) |
| ***B28B 7/18*** | (2006.01) |
| ***H01J 37/32*** | (2006.01) |
| ***H10P 72/72*** | (2026.01) |

(52) U.S. Cl.

CPC ............ *H10P 72/0432* (2026.01); *B28B 1/14* (2013.01); *B28B 7/18* (2013.01); *H01J 37/32449* (2013.01); *H01J 37/32715* (2013.01); *H10P 72/722* (2026.01)

(58) Field of Classification Search

CPC ...... H10P 72/0432; H10P 72/722; B28B 1/14; B28B 7/18; B28B 1/001; B28B 7/346; B28B 7/348; H01J 37/32449; H01J 37/32715; B33Y 10/00; B33Y 30/00; C04B 35/624; C04B 2235/6022

See application file for complete search history.

(56) References Cited

U.S. PATENT DOCUMENTS

| | | | | |
|---|---|---|---|---|
| 3,848,040 A * | 11/1974 | Confer | .................... | B28B 7/342 249/176 |
| 4,871,497 A * | 10/1989 | Natori | ........................ | B22F 3/22 264/317 |
| 6,375,880 B1 * | 4/2002 | Cooper | .................. | B33Y 70/00 264/318 |

(Continued)

FOREIGN PATENT DOCUMENTS

| | | | |
|---|---|---|---|
| CN | 115954310 A * | 4/2023 | ........... H10P 72/722 |
| JP | 7144603 B2 | 9/2022 | |

(Continued)

*Primary Examiner* — Jeffrie R Lund

(74) *Attorney, Agent, or Firm* — Muncy, Geissler, Olds & Lowe, P.C.

(57) ABSTRACT

A plug includes a plug body, a spiral gas flow path that is provided in the plug body and that extends from a lower surface of the plug body to an upper surface, and at least one branch path that branches from a position on the spiral gas flow path and that opens on an outer circumferential surface of the plug body or that is in communication with another spiral gas flow path that differs from the spiral gas flow path and that extends from a lower surface of the plug body to an upper surface.

8 Claims, 9 Drawing Sheets

(56) References Cited

U.S. PATENT DOCUMENTS

| | | | | |
|---|---|---|---|---|
| 7,517,490 | B2 * | 4/2009 | Miyazawa | C04B 35/624 264/635 |
| 11,654,451 | B2 * | 5/2023 | Bang | B05C 11/1042 137/340 |
| 11,715,652 | B2 * | 8/2023 | Ishikawa | H01J 37/32724 219/444.1 |
| 2017/0297111 | A1 * | 10/2017 | Myerberg | B28B 1/001 |
| 2022/0032501 | A1 | 2/2022 | Aoki et al. | |
| 2022/0246398 | A1 * | 8/2022 | Ishikawa | H01J 37/3244 |
| 2024/0006226 | A1 * | 1/2024 | Kojima | H10P 72/7624 |
| 2024/0213052 | A1 * | 6/2024 | Hashimoto | H10P 72/0432 |
| 2024/0213082 | A1 * | 6/2024 | Hashimoto | H10P 72/7624 |
| 2025/0105043 | A1 * | 3/2025 | Inoue | H10P 72/722 |
| 2025/0210394 | A1 * | 6/2025 | Ishikawa | H10P 72/722 |
| 2025/0273507 | A1 * | 8/2025 | Ishikawa | H10P 72/0434 |

FOREIGN PATENT DOCUMENTS

| | | | | | |
|---|---|---|---|---|---|
| JP | 7382978 | B2 | * | 11/2023 | H10P 72/7614 |
| KR | 100715012 | B1 | * | 5/2007 | H01J 37/32724 |
| KR | 20190091002 | A | * | 8/2019 | C23C 16/45512 |
| KR | 20230171783 | A | * | 12/2023 | H10P 72/722 |
| WO | WO-2020217406 | A1 | * | 10/2020 | B29C 64/10 |

* cited by examiner

PLUG, METHOD OF MANUFACTURING PLUG, AND MEMBER FOR SEMICONDUCTOR MANUFACTURING APPARATUS

BACKGROUND OF THE INVENTION

1. Field of the Invention

The present invention relates to a plug, a method of manufacturing a plug, and a member for semiconductor manufacturing apparatus.

2. Description of the Related Art

An existing member for semiconductor manufacturing apparatus includes an electrostatic chuck that has an upper surface that includes a wafer placement portion. For example, an electrostatic chuck disclosed in PTL 1 includes a ceramic plate that attracts and holds a wafer, a plug installation hole that is formed in the ceramic plate, a plug that is installed in the plug installation hole, and a cooling plate that is stuck to a lower surface of the ceramic plate. The plug has a spiral gas flow path in a dense plug body. In the case where the wafer that is placed on the wafer placement portion is processed by using plasma, high-frequency power is applied between the cooling plate and a flat plate electrode that is disposed at an upper portion of the wafer, and the plasma is generated at the upper portion of the wafer. In addition, helium that is a heat conduction gas is supplied to a back surface of the wafer via the spiral gas flow path of the plug in order to improve heat conduction between the wafer and the ceramic plate. A method of manufacturing the plug in PTL 1 includes a process of manufacturing a molded body by injecting and solidifying a ceramic slurry in a resin mold that is formed into a one-piece together with a core that corresponds to the spiral gas flow path.

CITATION LIST

Patent Literature

PTL 1: JP 7144603 B

SUMMARY OF THE INVENTION

However, the core that is formed into the one-piece together with the mold is a single spiral resin member that is elongated, and there is a problem in that the core is likely to be damaged with the core held by a bottom surface of the mold. For this reason, it is difficult to manufacture the plug with a good yield.

The present invention has been accomplished to solve the problem, and it is a main object of the present invention to provide a plug that can be manufactured with a good yield.

[1] A plug according to the present invention includes a plug body, a spiral gas flow path that is provided in the plug body and that extends from a lower surface of the plug body to an upper surface, and at least one branch path that branches from a position on the spiral gas flow path and that opens on an outer circumferential surface of the plug body or that is in communication with another spiral gas flow path that differs from the spiral gas flow path and that extends from a lower surface of the plug body to an upper surface.

The plug includes the branch path that branches from the position on the spiral gas flow path in the plug body. In the case where the branch path opens on the outer circumferential surface of the plug body, a mold that is used when the plug is manufactured includes a spiral core that corresponds to the spiral gas flow path, and the spiral core is held by an inner circumferential surface of the mold with a holding core that corresponds to the branch path interposed therebetween. For this reason, the spiral core can be prevented from being damaged, and the plug can be manufactured with a good yield. In the case where the branch path is in communication with the other spiral gas flow path that differs from the spiral gas flow path, the mold that is used when the plug is manufactured includes a spiral core that corresponds to the spiral gas flow path and another spiral core that corresponds to the other spiral gas flow path, the cores hold each other with the holding core that corresponds to the branch path interposed therebetween. For this reason, the core can be prevented from being damaged, and the plug can be manufactured with a good yield.

In the present specification, the words "up-down", "left-right", and "front-rear" are used to describe the present invention in some cases, but the words "up-down", "left-right", and "front-rear" merely represent relative positional relationships. For this reason, the word "up-down" is changed into the word "left-right" or the word "left-right" is changed into the word "up-down" in some cases where the direction of the plug is changed. These cases are also included in the technical scope of the present invention.

[2] As for the above plug (the plug described in [1] described above), the branch path may be in communication with the other spiral gas flow path and may open on the outer circumferential surface of the plug body. In this case, the core is remarkably prevented from being damaged.

[3] As for the above plug (the plug described in [1] or [2] described above), at least one branch path comprises a plurality of branch paths that branch from a plurality of positions on the spiral gas flow path. In this case, the spiral core that is provided in the mold that is used when the plug is manufactured is held by the inner circumferential surface of the mold or the other spiral core by using multiple holding cores. For this reason, the core is more effectively prevented from being damaged.

[4] As for the above plug (the plug described in [3] described above), the plurality of branch paths may be equiangularly spaced along a concentric circle of the plug body in a plan view. In this case, the spiral core that is provided in the mold that is used when the plug is manufactured is stably held by the multiple holding cores that are equiangularly spaced along the concentric circle of the plug body in a plan view.

[5] As for the above plug (the plug described in any one of [1] to [4] described above), the branch path may be in communication with the other spiral gas flow path, and the spiral gas flow path may surround the other spiral gas flow path. This enables a region of the plug body that is surrounded by the spiral gas flow path is effectively used, and the other spiral gas flow path can be provided.

[6] As for the above plug (the plug described in any one of [1] to [4] described above), the branch path may be in communication with the other spiral gas flow path, and the other spiral gas flow path may be adjacent to the spiral gas flow path. In this case, the diameter of a spiral of the spiral gas flow path and the diameter of a spiral of the other spiral gas flow path can be relatively freely designed.

[7] A method of manufacturing a plug according to the present invention is a method of manufacturing the above plug (the plug described in any one of [1] to [6] described above), and the method includes (a) a step of manufacturing a mold by using an organic material, the mold having a molding space that has the same shape as a molded body that is a precursor of the plug, the mold being formed into a one-piece together with a core that corresponds to the spiral gas flow path and the branch path or a core that corresponds to the spiral gas flow path, the other spiral gas flow path, and the branch path, (b) a step of manufacturing the molded body in the mold by injecting and solidifying a ceramic slurry in the molding space of the mold, (c) a step of obtaining the molded body by removing the mold from a one-piece of the mold and the molded body, and (d) a step of obtaining the plug by firing the molded body.

The method of manufacturing the plug enables the above plug (the plug described in any one of [1] to [6] described above) to be manufactured with a good yield.

At the step (a), the mold may be manufactured by using a 3D printer, the 3D printer may use, as a model material, a material that is insoluble in a predetermined cleaning solution and a component that is contained in the ceramic slurry after solidification and may use, as a support material, a material that is soluble in the predetermined cleaning solution after solidification. The meaning of "being insoluble" in the present specification includes being completely insoluble and being soluble to an extent that a desired shape can be maintained. This enables the mold that is formed into the one-piece together with the core to be relatively easily manufactured and eliminates a concern that the mold dissolves to an extent that the shape thereof cannot be maintained due to the component that is contained in the ceramic slurry.

At the step (b), a slurry that contains ceramic powder and a gelling agent may be used as the ceramic slurry, the gelling agent may be chemically reacted after the ceramic slurry is injected into the mold, the ceramic slurry may be caused to gel, and the molded body may be consequently manufactured in the mold. In this case, the ceramic slurry is filled in the molding space of the mold that is formed into the one-piece together with the core without space, and consequently, the molded body matches the shape of the molding space with precision.

A method of removing the mold at the step (c) is not particularly limited. For example, the mold may be removed by being melted and removed, or the mold may be removed by chemical decomposition (including, for example, thermal decomposition).

[8] A member for semiconductor manufacturing apparatus according to the present invention includes a ceramic plate that has an upper surface that includes a wafer placement portion, and the above plug (the plug described in any one of [1] to [6] described above) that is installed in a plug installation hole that extends through the ceramic plate in an up-down direction.

The member for semiconductor manufacturing apparatus can supply gas to a lower surface of the wafer that is placed on the wafer placement portion by using the spiral gas flow path of the plug.

DETAILED DESCRIPTION OF THE INVENTION

First Embodiment

Figure 1:
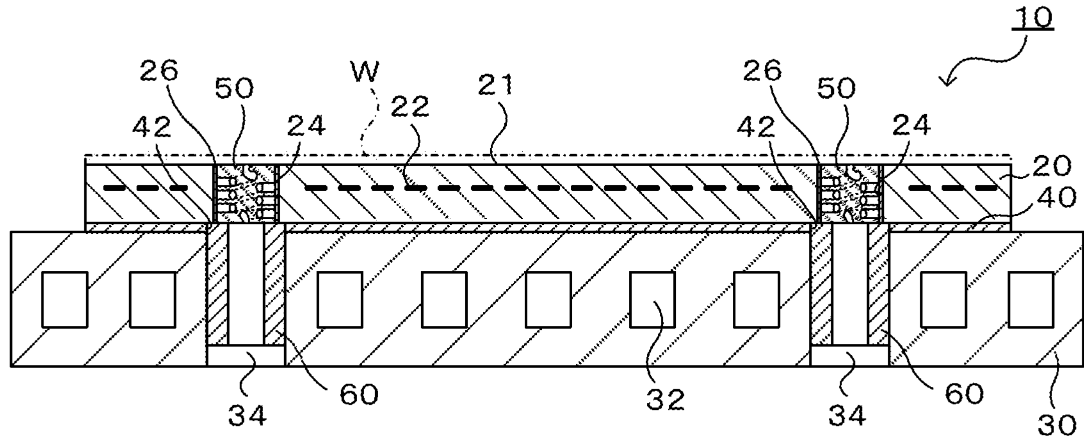
FIG. 1 illustrates a vertical cross-section of a member 10 for semiconductor manufacturing apparatus.
Figure 2:
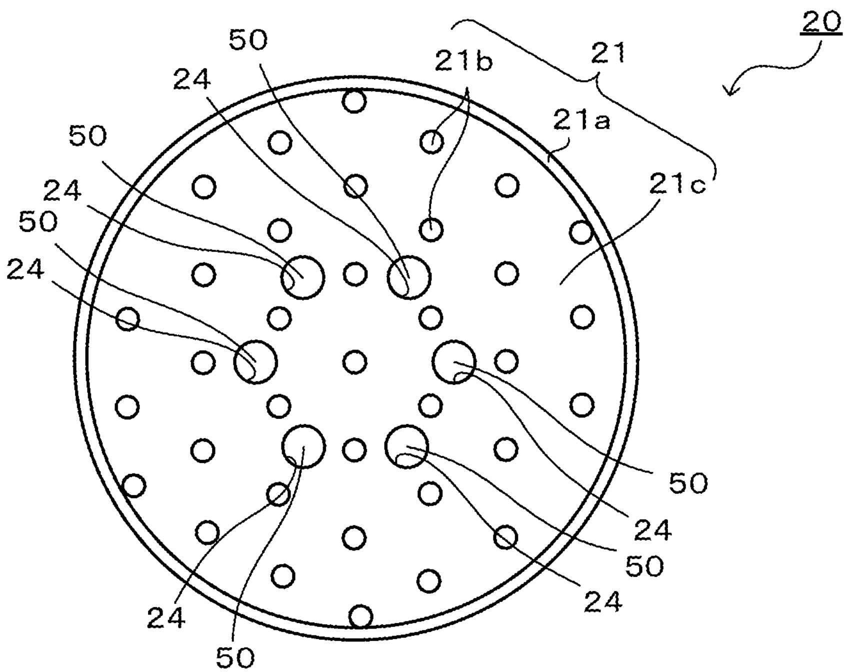
FIG. 2 is a plan view of a ceramic plate 20.
Figure 3:
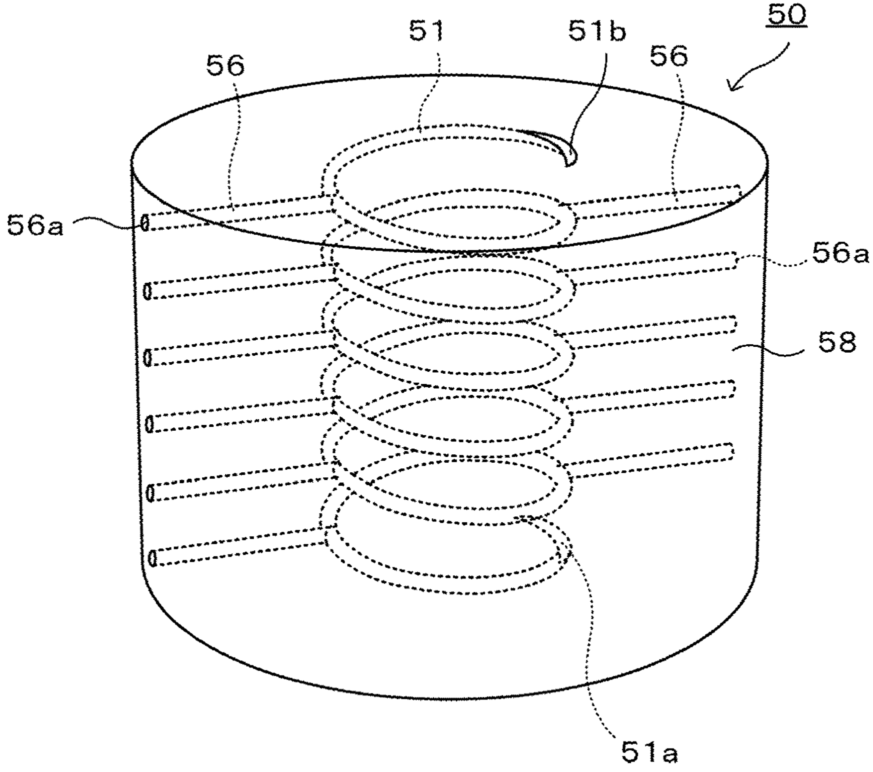
FIG. 3 is a perspective view of a plug 50.
Figure 4:
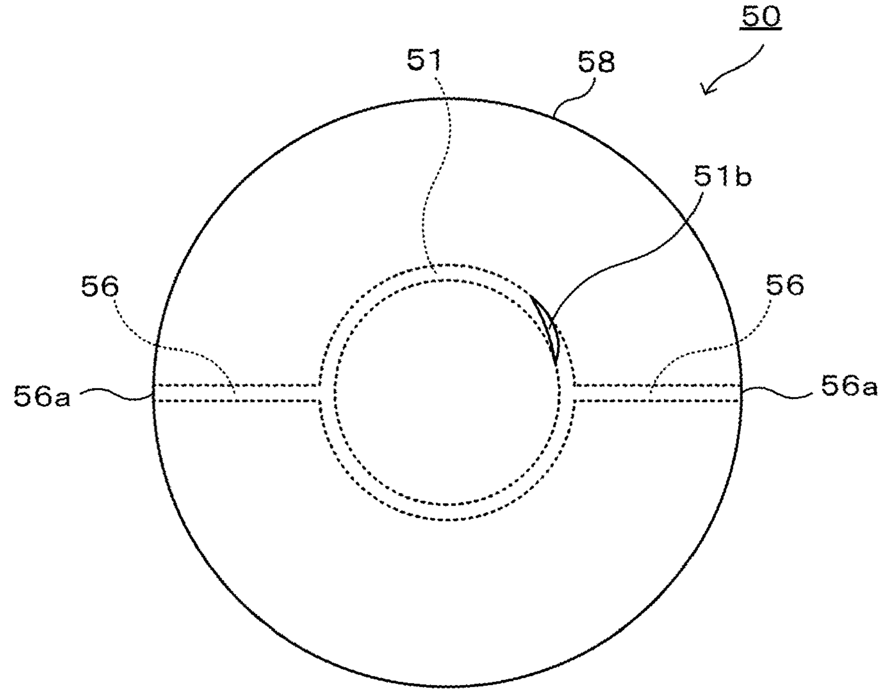
FIG. 4 is a plan view of the plug 50.

A preferred embodiment of the present invention will be described with reference to the drawings. FIG. 1 illustrates a vertical cross-section of a member 10 for semiconductor manufacturing apparatus. FIG. 2 is a plan view of a ceramic plate 20. FIG. 3 is a perspective view of a plug 50. FIG. 4 is a plan view of the plug 50.

The member 10 for semiconductor manufacturing apparatus includes the ceramic plate 20, a cooling plate 30, a joining layer 40, the plugs 50, and insulating pipes 60.

The ceramic plate 20 is a ceramic disk plate (for example, a diameter of 300 mm, and a thickness of 5 mm) such as an alumina sintered body or an aluminum nitride sintered body. The ceramic plate 20 contains an electrode 22. At a wafer placement portion 21 of the ceramic plate 20, as illustrated in FIG. 2, a seal band 21*a* is formed along an outer edge, and multiple circular small projections 21*b* are formed over the entire surface. The seal band 21*a* and the circular small projections 21*b* have the same height, and the height thereof is, for example, several μm to several 10 μm. The electrode 22 is a planar mesh electrode that is used as an electrostatic electrode, and a direct voltage can be applied thereto. When the direct voltage is applied to the electrode 22, a wafer W is attracted and secured to the wafer placement portion 21 (specifically, an upper surface of the seal band 21*a* and upper surfaces of the circular small projections 21*b*) by using electrostatic attraction force. When applying the direct voltage ends, the wafer W that is attracted and secured to the wafer placement portion 21 is released. A portion of the wafer placement portion 21 on which the seal band 21*a* and the circular small projections 21*b* are not provided is referred to as a reference surface 21*c*.

Plug installation holes 24 are cylindrical through-holes that extend through the ceramic plate 20 in an up-down direction. The plug installation holes 24 are provided at multiple positions (for example, multiple positions equally spaced from each other in a circumferential direction as illustrated in FIG. 2) in the ceramic plate 20. The plugs 50 described later are installed in the plug installation holes 24.

The cooling plate 30 is joined to a lower surface of the ceramic plate 20. The cooling plate 30 is a disk plate (a disk plate that has a diameter equal to or larger than the diameter of the ceramic plate 20) that has good thermal conductivity. The cooling plate 30 contains a refrigerant flow path 32 through which refrigerant circulates and gas holes 34 in which gas is supplied to the porous plugs 50. The refrigerant is preferably a liquid and preferably has electrical insulation properties. An example of a liquid that has the electrical insulation properties is a fluorine inert liquid. The refrigerant flow path 32 is formed in a one-stroke pattern from an inlet to an outlet over the entire cooling plate 30 in a plan view. The gas holes 34 have a cylindrical shape and face the plug installation holes 24. Examples of the material of the cooling plate 30 include a metal material and a composite material of metal and ceramics. Examples of the metal material include Al, Ti, Mo, or an alloy thereof. Examples of the composite material of metal and ceramics include a metal matrix composite material (MMC) and a ceramic matrix composite material (CMC). Specific examples of the composite material include a material that contains Si, SiC, and Ti, a material obtained by impregnating a SiC porous body with Al and/or Si, and a composite material of $Al_2O_3$ and TiC. The material that contains Si, SiC, and Ti is referred to as SiSiCTi. The material that is obtained by impregnating the SiC porous body with Al is referred to as AlSiC. The material that is obtained by impregnating the SiC porous body with Si is referred to as SiSiC. The material of the cooling plate 30 is preferably a material that has a coefficient of thermal expansion close to that of the material of the ceramic plate 20. The cooling plate 30 is also used as a RF electrode. Specifically, an upper electrode (not illustrated) is disposed above the wafer placement portion 21, and plasma is generated when high-frequency power is applied between parallel flat plate electrodes that include the upper electrode and the cooling plate 30.

The Joining layer 40 joins the lower surface of the ceramic plate 20 and an upper surface of the cooling plate 30 to each other. The joining layer 40 may be composed of, for example, solder or a brazing metal material. The joining layer 40 is formed by, for example, TCB (Thermal compression bonding). The TCB is a known method of compressing and joining two members in a state in which the two members to be joined interpose a metal joining material therebetween and are heated to a temperature equal to or less than the solidus temperature of the metal joining material. The joining layer 40 may be an organic adhesive layer (a resin adhesive layer). For example, the organic resin layer is formed by solidifying an organic adhesive. The joining layer 40 has round holes 42 that extend through the joining layer 40 in the up-down direction at positions at which the round holes 42 face the gas holes 34.

The plugs 50 are columnar members and are installed in the plug installation holes 24. Outer circumferential surfaces of the plugs 50 are stuck to inner circumferential surfaces of the plug installation holes 24 by using adhesive layers 26. The adhesive layers 26 may be organic adhesive layers (resin adhesive layers) or inorganic adhesive layers. As illustrated in FIG. 3 and FIG. 4, each plug 50 includes a columnar plug body 58 composed of dense ceramics, a spiral gas flow path 51 that is provided in the plug body 58, and branch paths 56 that branch from positions on the spiral gas flow path 51. For example, the plug body 58 may be composed of the same ceramic material as that of the ceramic plate 20. The spiral gas flow path 51 allows gas to pass therethrough and extends from a lower surface of the plug body 58 to an upper surface. A portion of the spiral gas flow path 51 that opens from the lower surface of the plug body 58 is referred to as a lower opening 51*a*, and a portion thereof that opens from the upper surface of the plug body 58 is referred to as an upper opening 51*b*. The branch paths 56 branch from the multiple positions on the spiral gas flow path 51 and have opening portions 56*a* in an outer circumferential surface of the plug body 58. The branch paths 56 are provided in parallel with a left-right direction. In a plan view of the plug 50, the multiple branch paths 56 are equiangularly spaced (at an interval of 180° in FIG. 4) along a concentric circle of the plug body 58.

The maximum length Hmax of the spiral gas flow path 51 and the branch paths 56 in the up-down direction is preferably 0.5 mm or less. This enables arc discharge to be sufficiently inhibited from occurring in the spiral gas flow path 51 and the branch paths 56. When the heat conduction gas is helium, it is thought that electrons that are generated by ionization of helium that is supplied to the plugs 50 from the gas holes 34 are accelerated and collide with another helium while plasma is generated, and the arc discharge consequently occurs. When the maximum length Hmax of the spiral gas flow path 51 and the branch paths 56 in the up-down direction is 0.5 mm or less, the electrons are not sufficiently accelerated (in other words, a state in which energy lacks) but collide with the other helium, and this prevents arc discharge from occurring. In the case where arc discharge is to be more effectively prevented, the maximum length Hmax is preferably 0.3 mm or less. The diameters of the spiral gas flow path 51 and the branch paths 56 are preferably 0.5 mm or less, more preferably 0.3 mm or less.

The insulating pipes 60 are circular pipes composed of dense ceramics in a plan view. Outer circumferential surfaces of the insulating pipes 60 are stuck to inner circumferential surfaces of the round holes 42 of the joining layer 40 and inner circumferential surfaces of the gas holes 34 of the cooling plate 30 by using adhesive layers not illustrated. The adhesive layers may be organic adhesive layers (resin adhesive layers) or inorganic adhesive layers. The adhesive layers may be provided between an upper surface of the insulating pipes 60 and the lower surface of the ceramic plate 20. Inner portion of the insulating pipes 60 are in communication with the plugs 50. For this reason, gas that is introduced into the insulating pipes 60 passes through the plugs 50 and is supplied to a back surface of the wafer W.

An example of the use of the member 10 for semiconductor manufacturing apparatus thus configured will now be described. The wafer W is first placed on the wafer placement portion 21 with the member 10 for semiconductor manufacturing apparatus installed in a chamber not illustrated. The pressure of the chamber is decompressed by a vacuum pump and is adjusted such that a predetermined degree of vacuum is achieved. A direct voltage is applied to the electrode 22 of the ceramic plate 20 to generate electrostatic attraction force, and the wafer W is attracted and secured to the wafer placement portion 21 (specifically, the upper surface of the seal band 21*a* and the upper surfaces of the circular small projections 21*b*). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the cooling plate 30 of the member 10 for semiconductor manufacturing apparatus, and plasma is generated. The surface of the wafer W is processed by the generated plasma. The refrigerant circulates through the refrigerant flow path 32 of the cooling plate 30. Backside gas is introduced into the gas holes 34 from a gas tank not illustrated. Heat conduction gas (such as helium) is used as the backside gas. The backside gas passes through the insulating pipes 60 and the plugs 50, is supplied to a space between the back surface of the wafer W and the reference surface 21*c* of the wafer placement portion 21, and is sealed.

The backside gas enables heat conduction between the wafer W and the ceramic plate 20 to be efficient.

Figure 5:
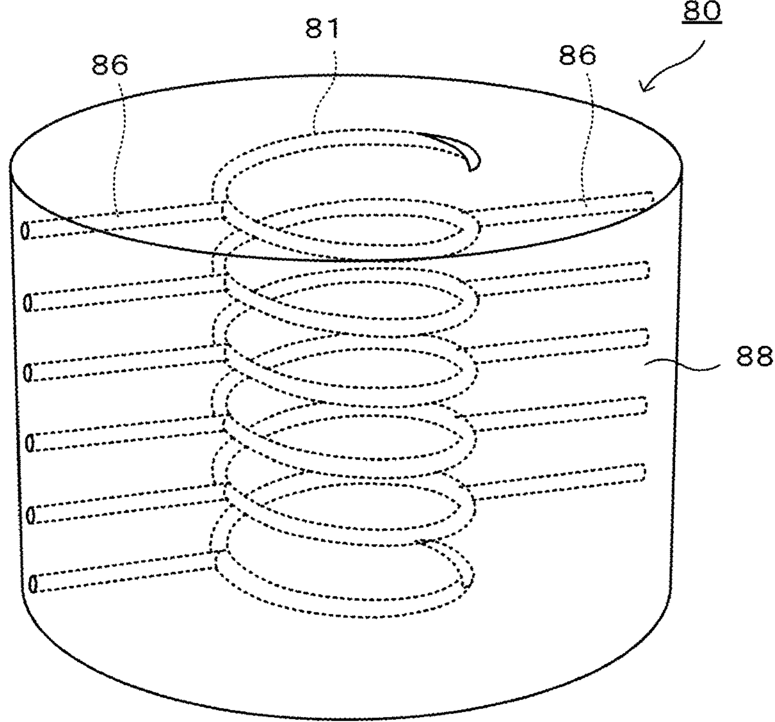
FIG. 5 is a perspective view of a molded body 80.

An example of manufacturing each plug 50 will now be described. The plug 50 is manufactured by following steps (a) to (d) described below in this order. FIG. 5 is a perspective view of a molded body 80. The molded body 80 illustrated in FIG. 5 that is fired corresponds to the plug 50. The dimensions of the molded body 80 are determined based on the dimensions of the plug 50 in consideration for tightening during firing. The molded body 80 includes hollow portions 81 and 86 that are to be the spiral gas flow path 51 and the branch paths 56 after firing in a molded body base 88. The hollow portion 81 opens from an upper surface and a lower surface of the molded body base 88. The hollow portions 86 open on an outer circumferential surface of the molded body base 88.

Step (a)

Figure 6:
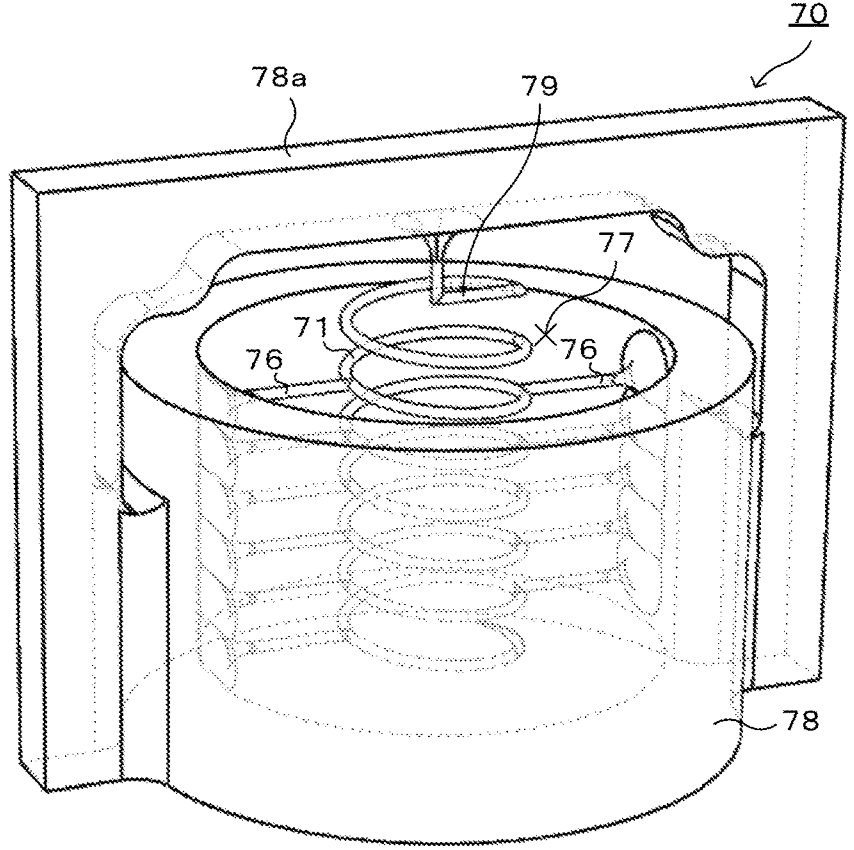
FIG. 6 is a perspective view of a mold 70.

At the step (a), a mold 70 is manufactured. FIG. 6 is a perspective view of the mold 70. As illustrated in FIG. 6, the mold 70 includes a mold body 78 that has a bottomed cylindrical shape and cores 71 and 76 that correspond to the hollow portions 81 and 86 of the molded body 80. The core 71 is a spiral member that corresponds to the hollow portion 81 (a portion that is finally to be the spiral gas flow path 51). The cores 76 are rod members that correspond to the hollow portions 86 (portions that are finally to be the branch paths 56). The mold 70 has a molding space 77 that has the same shape as the molded body 80. The molding space 77 is a space obtained by removing the spiral core 71 and the rod cores 76 from a cylindrical space inside the mold body 78. A lower end of the spiral core 71 is formed into a one-piece together with a bottom surface of the mold body 78. An upper end of the core 71 is secured to a bridge portion **78*a* that extends across an upper portion of the mold body 78 with a holding member 79 interposed therebetween. The rod cores 76 extend in a horizontal direction (outward in a radial direction) from positions on the core 71 and are formed into a one-piece together with an inner circumferential surface of the mold body 78**.

The mold 70 is manufactured by using a known 3D printer. The 3D printer repeats a series of operations of forming an unsolidified layer object by discharging an unsolidified fluid from a head portion onto a stage and solidifying the unsolidified layer object and consequently forms a structure. The 3D printer includes, as the unsolidified fluid, a model material of which a finally necessary portion of the mold 70 is composed and a support material of which a finally removed portion of the mold 70 that is a base that supports the model material is composed. Here, a material (for example, wax such as paraffin wax) that is insoluble in a predetermined cleaning solution (such as water, an organic solvent, acid, or an alkaline solution) and a component that is contained in a ceramic slurry described later after solidification is used as the model material. A material (for example, hydroxylation wax) that is soluble in the predetermined cleaning solution after solidification is used as the support material. An example of the predetermined cleaning solution is isopropyl alcohol. The 3D printer forms the structure by using slice data of layers sliced in the horizontal direction at a regular interval upward from below the mold 70. The slice data is obtained by processing CAD data. The slice data includes slice data in which the model material and the support material are present and slice data in which only the model material is present. The structure that is formed by the 3D printer is immersed into isopropyl alcohol such that the solidified support material is dissolved and removed, and consequently, an object composed of the solidified model material, that is, the mold 70 is obtained.

Step (b)

At the step (b), the molded body 80 is manufactured in the mold 70. Here, the molded body 80 is manufactured by mold casting. In the mold casting, a ceramic slurry that contains ceramic powder, a solvent, dispersant, and a gelling agent is injected into the molding space 77 of the mold 70, the gelling agent is chemically reacted, the ceramic slurry is caused to gel, and the molded body 80 is consequently manufactured in the mold 70. The mold casting can be performed in accordance with the content described in PTL 1.

Step (c)

At the step (c), the mold 70 is removed from a one-piece into which the mold 70 and the molded body 80 are formed, and the molded body 80 is obtained. In the case where the material of the mold 70 has a melting point (the upper limit of the temperature in the case where the melting point is represented by using a temperature range) equal to or less than the drying temperature of the molded body 80, the mold 70 can be melted and removed at the drying temperature when the molded body 80 is dried. For example, in the case where the material of the mold 70 is wax that is melted at 70° C., the mold 70 is melted and removed when the molded body 80 is dried at 80° C., and the molded body 80 can be obtained.

Step (d)

At the step (d), the molded body 80 is degreased and is subsequently fired, and the plug 50 is manufactured. A degreasing temperature and a firing temperature (the maximum temperature) may be appropriately determined in consideration for the temperature at which ceramic powder that is contained in the molded body 80 is sintered. A degreasing atmosphere and a firing atmosphere may be appropriately selected from the atmosphere, an inert gas atmosphere, a vacuum atmosphere, and a hydrogen atmosphere.

The plug 50 described in detail above includes the branch paths 56 that branch at the positions on the spiral gas flow path 51 in the plug body 58. The branch paths 56 open on the outer circumferential surface of the plug body 58. The mold 70 that is used when the plug 50 is manufactured is formed into a one-piece together with the spiral core 71 that corresponds to the spiral gas flow path 51. The spiral core 71 is held by the inner circumferential surface of the mold body 78 with the rod cores 76 that correspond to the branch paths 56 interposed therebetween. For this reason, the spiral core 71 can be prevented from being damaged, and the plug 50 can be manufactured with a good yield.

The branch paths 56 of the plug 50 branch from the multiple positions on the spiral gas flow path 51. Consequently, the spiral core 71 that is provided in the mold 70 that is used when the plug 50 is manufactured is held by the inner circumferential surface of the mold 70 by using the multiple rod cores 76. For this reason, the spiral core 71 is more effectively prevented from being damaged.

The multiple branch paths 56 are equiangularly spaced along the concentric circle of the plug body 58 in a plan view. Consequently, the spiral core 71 that is provided in the mold 70 that is used when the plug 50 is manufactured is stably held by the multiple rod cores 76 that are equiangularly spaced in a plan view.

Second Embodiment

According to a second embodiment, plugs 150 are used instead of the plugs 50 according to the first embodiment.

Figure 7:
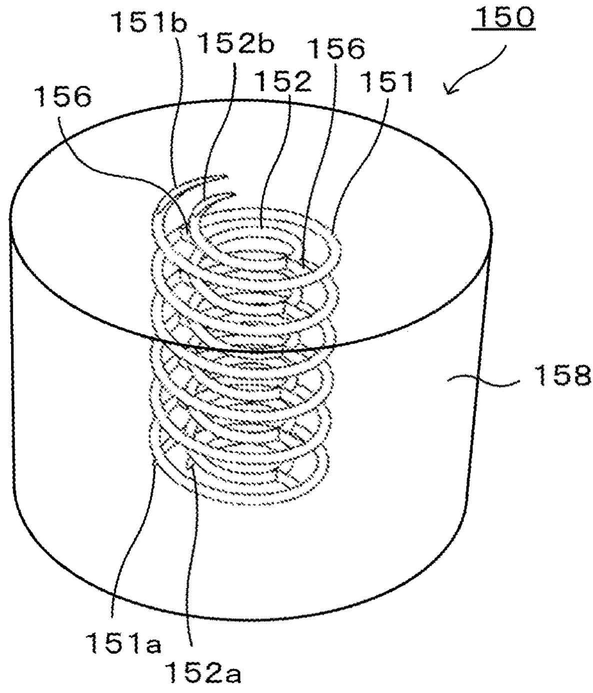
FIG. 7 is a reference perspective view of a plug 150.
Figure 8:
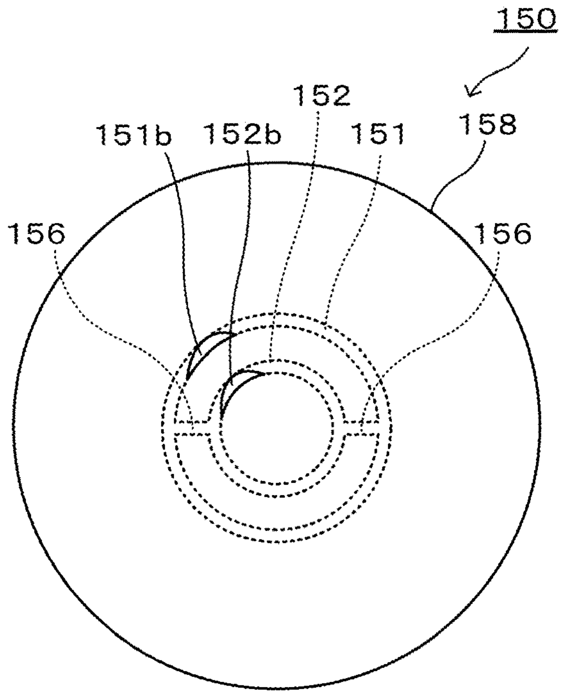
FIG. 8 is a plan view of the plug 150.

For this reason, the plugs 150 will now be described. FIG. 7 is a reference perspective view (a perspective view in which first and second spiral gas flow paths 151 and 152 and the branch paths 156 that are to be originally represented by using hidden lines (dashed lines) are presented by using solid lines for convenience) of one of the plugs 150. FIG. 8 is a plan view of the plug 150.

The plug 150 is a columnar member. The plug 150 includes a columnar plug body 158 composed of dense ceramic, the first and second spiral gas flow paths 151 and 152 that are provided in the plug body 158, and the branch paths 156 that branch from positions on the first spiral gas flow path 151. For example, the plug body 158 may be composed of the same ceramic material as the ceramic plate 20. The first spiral gas flow path 151 allows gas to pass therethrough and extends from a lower opening **151*a* that is provided in a lower surface of the plug body 158 to an upper opening 151*b* that is provided in an upper surface. The second spiral gas flow path 152 allows gas to pass therethrough, differs from the first spiral gas flow path 151, and extends from a lower opening 152*a* that is provided in the lower surface of the plug body 158 to an upper opening 152*b* that is provided in the upper surface. The first spiral gas flow path 151 surrounds the second spiral gas flow path 152. The first spiral gas flow path 151 and the second spiral gas flow path 152 are concentric with each other. An inner diameter of the first spiral gas flow path 151 is larger than an outer diameter of the second spiral gas flow path 152**.

The branch paths 156 branch from the multiple positions on the first spiral gas flow path 151 and are in communication with the second spiral gas flow path 152. The branch paths 156 are horizontally provided. The maximum length Hmax of the first and second spiral gas flow paths 151 and 152 and the branch paths 156 in the up-down direction is preferably 0.5 mm or less. This enables arc discharge to be sufficiently inhibited from occurring in the first and second spiral gas flow paths 151 and 152 and the branch paths 156. The diameters of the first and second spiral gas flow paths 151 and 152 and the branch paths 156 are preferably 0.5 mm or less. In a plan view of the plug 150, the multiple branch paths 156 are equiangularly spaced (at an interval of 180° in FIG. 8) along a concentric circle of the plug body 158.

Figure 9:
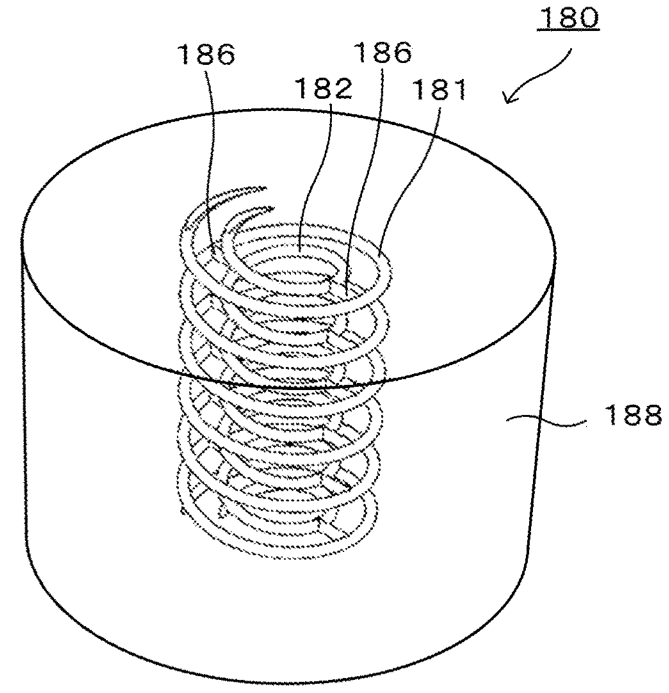
FIG. 9 is a reference perspective view of a molded body 180.

An example of manufacturing each plug 150 will now be described. The plug 150 is manufactured by following steps (a) to (d) described below in this order. FIG. 9 is a reference perspective view (a perspective view in which hollow portions 181, 182, and 186 that are to be originally represented by using hidden lines (dashed lines) are presented by using solid lines for convenience) of a molded body 180. The molded body 180 illustrated in FIG. 9 that is fired corresponds to the plug 150. The dimensions of the molded body 180 are determined based on the dimensions of the plug 150 in consideration for tightening during firing. The molded body 180 includes the hollow portions 181, 182, and 186 that are to be the first and second spiral gas flow paths 151 and 152 and the branch paths 156 after firing in a molded body base 188. The hollow portions 181 and 182 open from an upper surface and a lower surface of the molded body base 188.

Step (a)

Figure 10:
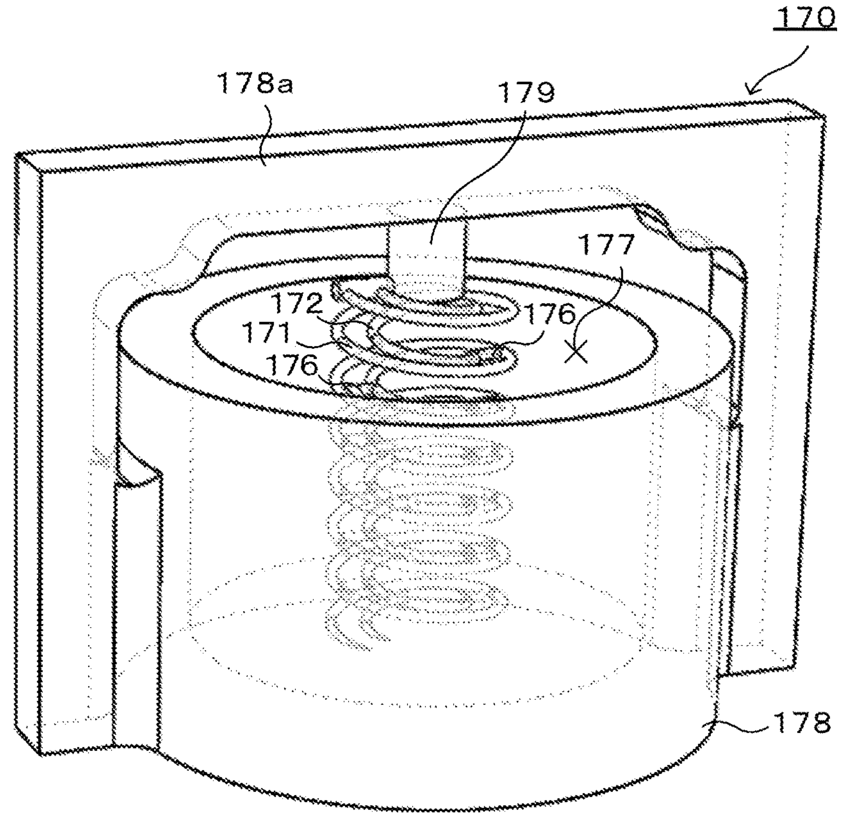
FIG. 10 is a perspective view of a mold 170.

At the step (a), a mold 170 is manufactured. FIG. 10 is a perspective view of the mold 170. As illustrated in FIG. 10, the mold 170 includes a mold body 178 that has a bottomed cylindrical shape and cores 171, 172, and 176 that correspond to the hollow portions 181, 182, and 186 of the molded body 180. The core 171 is a spiral member that corresponds to the hollow portion 181 (a portion that is finally to be the first spiral gas flow path 151). The core 172 is a spiral member that corresponds to the hollow portion 182 (a portion that is finally to be the second spiral gas flow path 152). The cores 176 are rod members that correspond to the hollow portions 186 (portions that are finally to be the branch paths 156). The mold 170 has a molding space 177 that has the same shape as the molded body 180. The molding space 177 is a space obtained by removing the cores 171, 172, and 176 from a cylindrical space inside the mold body 178. Lower ends of the spiral cores 171 and 172 are formed into a one-piece together with a bottom surface of the mold body 178. Upper ends of the cores 171 and 172 are secured to a bridge portion **178*a* that extends across an upper portion of the mold body 178 with a holding member 179 interposed therebetween. The rod cores 176 extend in the horizontal direction (outward in the radial direction) from positions on the core 171 and are connected to the other spiral core 172. The mold 170** is manufactured by a known 3D printer described according to the first embodiment.

Steps (b) to (d)

At the step (b), the molded body 180 is manufactured in the mold 170. Here, the molded body 180 is manufactured by mold casting. At the step (c), the mold 170 is removed from a one-piece into which the mold 170 and the molded body 180 are formed, and the molded body 180 is obtained. At the step (d), the molded body 180 is degreased and is subsequently fired, and the plug 150 is manufactured. The steps (b) to (d) are followed in accordance with the steps (b) to (d) according to the first embodiment.

The plug 150 described in detail above includes the branch paths 156 that branch from the positions on the first spiral gas flow path 151 in the plug body 158. The branch paths 156 are in communication with the second spiral gas flow path 152 that differs from the first spiral gas flow path 151. The mold 170 that is used when the plug 150 is manufactured includes the spiral core 171 that corresponds to the first spiral gas flow path 151 and the spiral core 172 that corresponds to the second spiral gas flow path 152. The cores 171 and 172 hold each other with the rod cores 176 that correspond to the branch paths 156 interposed therebetween. For this reason, the spiral cores 171 and 172 can be prevented from being damaged, and the plug 150 can be manufactured with a good yield.

The branch paths 156 of the plug 150 branch from the multiple positions on the first spiral gas flow path 151. Consequently, the spiral core 171 that is provided in the mold 170 that is used when the plug 150 is manufactured and the other spiral core 172 hold each other by using the multiple rod cores 176, and accordingly, the spiral cores 171 and 172 are more effectively prevented from being damaged.

The multiple branch paths 156 are equiangularly spaced along the concentric circle of the plug body 158 in a plan view. Consequently, the spiral core 171 that is provided in the mold 170 is stably held by the multiple rod cores 176 that are equiangularly spaced in a plan view.

The first spiral gas flow path 151 surrounds the second spiral gas flow path 152. For this reason, a region of the plug body 158 that is surrounded by the first spiral gas flow path 151 is effectively used, and the second spiral gas flow path 152 can be provided.

According to the second embodiment, the number of the spiral gas flow paths is larger than that according to the first embodiment, and accordingly, the amount of gas that is supplied to the lower surface of the wafer W can be increased.

Third Embodiment

According to a third embodiment, plugs 250 are used instead of the plugs 50 according to the first embodiment.

Figure 11:
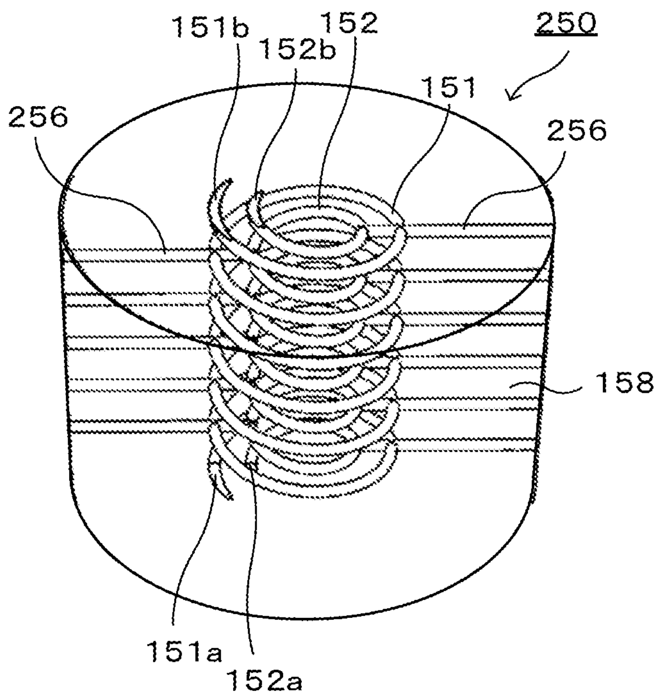
FIG. 11 is a reference perspective view of a plug 250.
Figure 12:
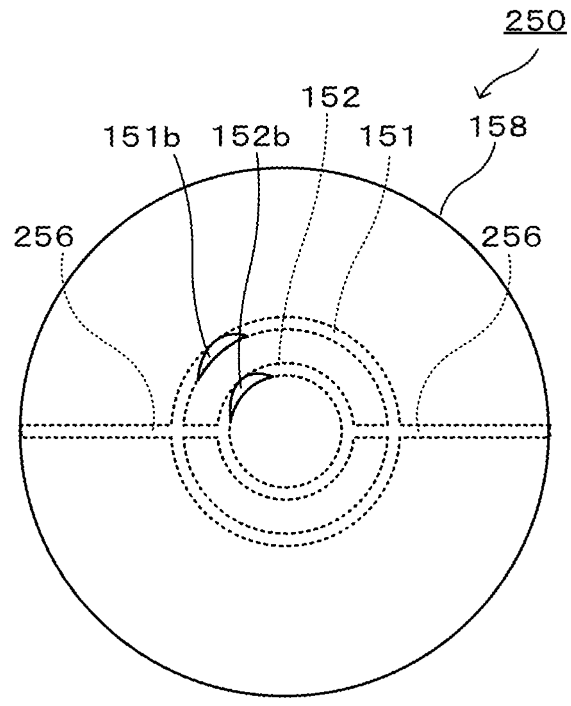
FIG. 12 is a plan view of the plug 250.

For this reason, the plugs 250 will now be described. FIG. 11 is a reference perspective view (a perspective view in which the first and second spiral gas flow paths 151 and 152 and branch paths 256 that are to be originally represented by using hidden lines (dashed lines) are presented by using solid lines for convenience) of one of the plugs 250. FIG. 12 is a plan view of the plug 250.

The plug 250 has the same structure as the plug 150 except that the branch paths 156 of the plug 150 are elongated so as to open on an outer circumferential surface of the plug body 158 as the branch paths 256. For this reason, components of the plug 250 like to those of the plug 150 are designated by using like reference signs, and the description thereof is omitted. In a plan view of the plug 250, the multiple branch paths 256 are equiangularly spaced (at an interval of 180° in FIG. 12) along the concentric circle of the plug body 158.

An example of manufacturing each plug 250 will now be described. The plug 250 is manufactured by following the steps (a) to (d) according to the second embodiment. The mold that is used to manufacture the plug 250 is changed such that the rod cores 176 of the mold 170 according to the second embodiment extend outward in the radial direction to an inner circumferential wall of the mold body 178.

The plug 250 described in detail above exerts the same effects as the plug 150 according to the second embodiment. In addition to this, the branch paths 256 open on the outer circumferential surface of the plug body 158. For this reason, as for the mold that is used to manufacture the plug 250, the spiral core that corresponds to the first spiral gas flow path 151 and the spiral core that corresponds to the second spiral gas flow path 152 hold each other with the rod cores that correspond to the branch paths 256 interposed therebetween and are held by the inner circumferential surface of the mold with the rod cores interposed therebetween. For this reason, the spiral cores are remarkably prevented from being damaged.

Fourth Embodiment

Figure 13:
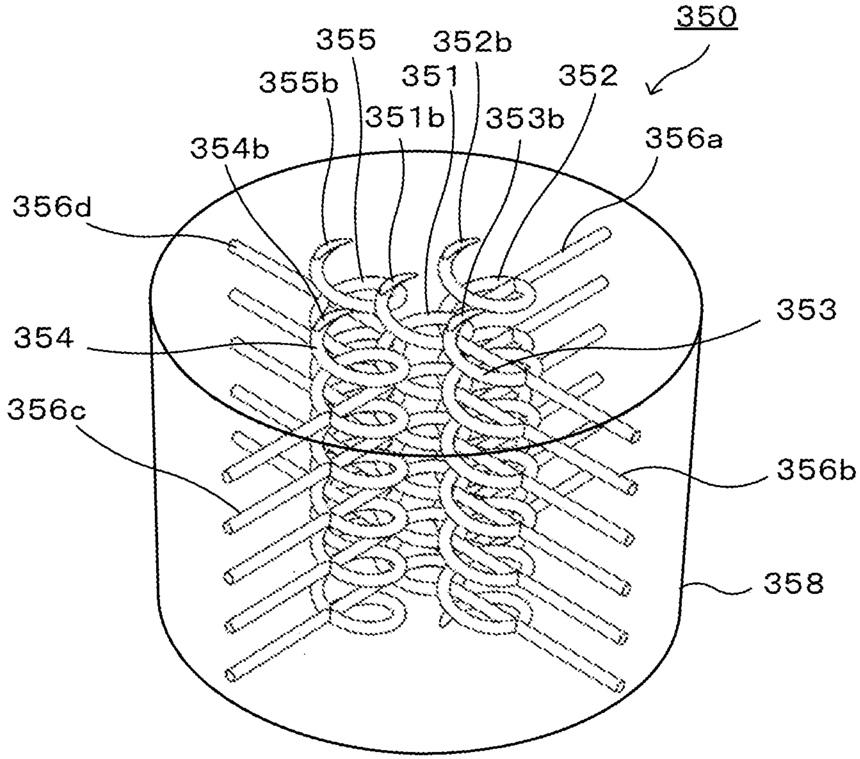
FIG. 13 is a reference perspective view of a plug 350.
Figure 14:
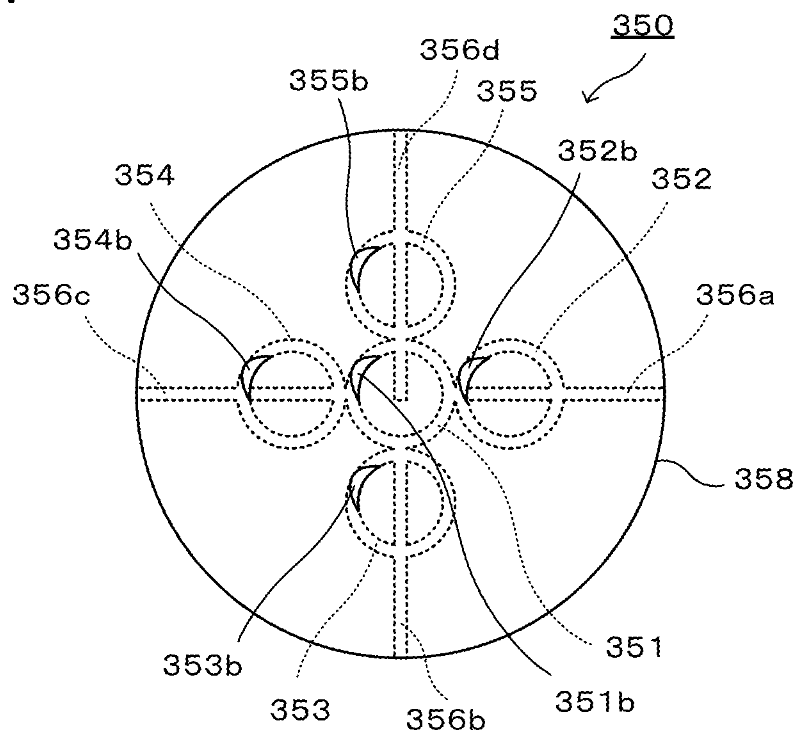
FIG. 14 is a plan view of the plug 350.

According to a fourth embodiment, plugs 350 are used instead of the plugs 50 according to the first embodiment. For this reason, the plugs 350 will now be described. FIG. 13 is a reference perspective view (a perspective view in which first to fifth spiral gas flow paths 351 to 355 that are to be originally represented by using hidden lines (dashed lines), for example, are presented by using solid lines for convenience) of one of the plugs 350. FIG. 14 is a plan view of the plug 350.

The plug 350 is a columnar member. The plug 350 includes a columnar plug body 358 composed of dense ceramic, the first to fifth spiral gas flow paths 351 to 355 that are provided in the plug body 358, and branch paths **356*a* to 356*d* that branch from positions on the first spiral gas flow path 351. For example, the plug body 358 may be composed of the same ceramic material as the ceramic plate 20. The first to fifth spiral gas flow paths 351 to 355 allow gas to pass therethrough and extend from a lower opening (not illustrated) that is provided in a lower surface of the plug body 358 to upper openings 351*b* to 355*b* that are provided in an upper surface. The first to fifth spiral gas flow paths 351 to 355 are adjacent to each other in the plug body 358. Specifically, the central axis of the first spiral gas flow path 351 matches the central axis of the plug body 358, and the second to fifth spiral gas flow paths 352 to 354 surround the first spiral gas flow path 351**.

The branch paths **356*a* branch from multiple positions on the first spiral gas flow path 351, are in communication with the second spiral gas flow path 352, and open on an outer circumferential surface of the plug body 358. The multiple branch paths 356*a* are aligned in a line in the up-down direction. The branch paths 356*b* branch from multiple positions on the first spiral gas flow path 351, are in communication with the third spiral gas flow path 353, and open on the outer circumferential surface of the plug body 358. The multiple branch paths 356*b* are aligned in a line in the up-down direction. The branch paths 356*c* branch from multiple positions on the first spiral gas flow path 351, are in communication with the fourth spiral gas flow path 354, and open on the outer circumferential surface of the plug body 358. The multiple branch paths 356*c* are aligned in a line in the up-down direction. The branch paths 356*d* branch from multiple positions on the first spiral gas flow path 351, are in communication with the fifth spiral gas flow path 355, and open on the outer circumferential surface of the plug body 358. The multiple branch paths 356*d* are aligned in a line in the up-down direction. The maximum length Hmax of the first to fifth spiral gas flow paths 351 to 355 and the branch paths 356*a* to 356*d* in the up-down direction is preferably 0.5 mm or less. This enables arc discharge to be sufficiently inhibited from occurring in the first to fifth spiral gas flow paths 351 to 355 and the branch paths 356*a* to 356*d*. The diameters of the first to fifth spiral gas flow paths 351 to 355 and the branch paths 356*a* to 356*d* are preferably 0.5 mm or less. In a plan view of the plug 350, the branch paths 356*a* to 356*d* are radially provided so as to be equiangularly spaced (at an interval of 90° in FIG. 14) along a concentric circle of the plug body 358. The branch paths 356*a* to 356*d*** are horizontally provided.

The first spiral gas flow path 351 corresponds to a spiral gas flow path according to the present invention, and the second to fifth spiral gas flow paths 352 to 355 correspond to the other spiral gas flow paths.

Figure 15:
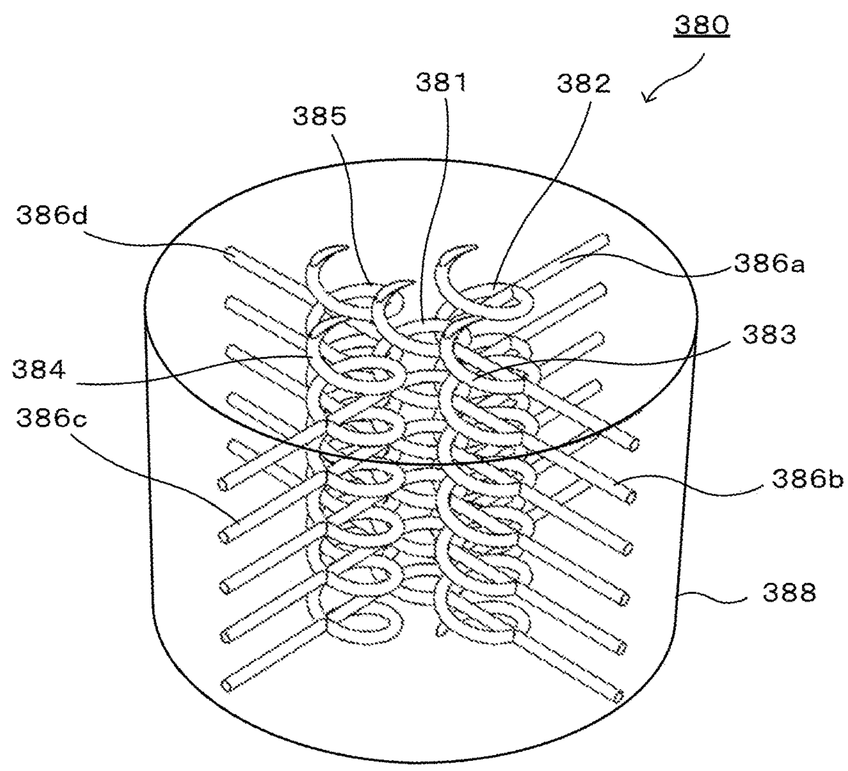
FIG. 15 is a reference perspective view of a molded body 380.

An example of manufacturing each plug 350 will now be described. The plug 350 is manufactured by following steps (a) to (d) described below in this order. FIG. 15 is a reference perspective view (a perspective view in which hollow portions 381 to 385 and **386*a* to 386*d* that are to be originally represented by using hidden lines (dashed lines) are presented by using solid lines for convenience) of a molded body 380. The molded body 380 illustrated in FIG. 15 that is fired corresponds to the plug 350. The dimensions of the molded body 380 are determined based on the dimensions of the plugs 350 in consideration for tightening during firing. The molded body 380 includes the hollow portions 381 to 385 that are to be the first to fifth spiral gas flow paths 351 to 355 after firing and the hollow portions 386*a* to 386*d* that are to be the branch paths 356*a* to 356*d* after firing in a molded body base 388. The hollow portions 381 to 385 open from an upper surface and a lower surface of the molded body base 388**.

Step (a)

Figure 16:
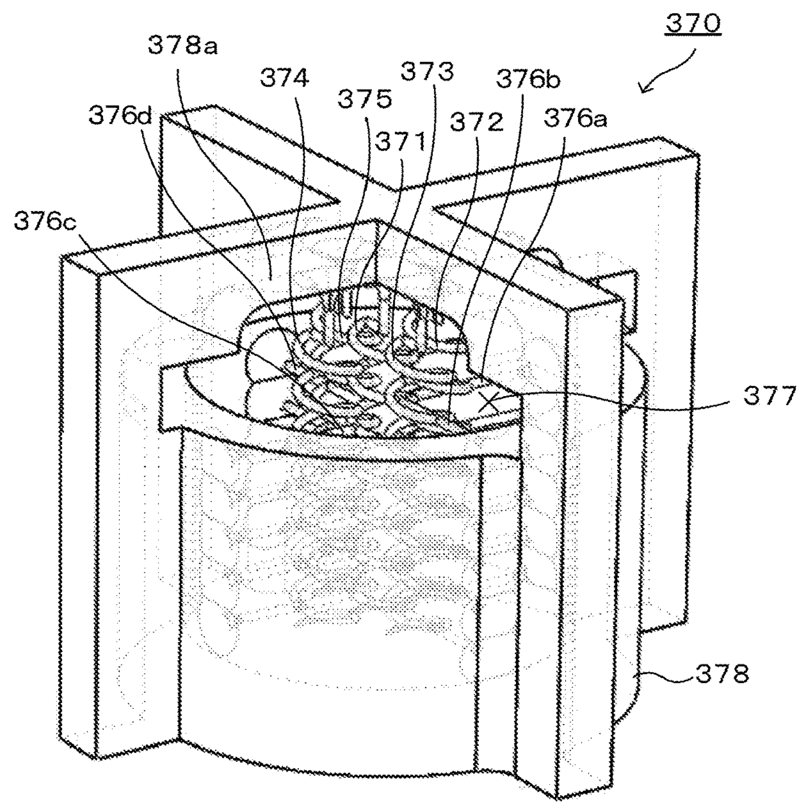
FIG. 16 is a perspective view of a mold 370.

At the step (a), a mold 370 is manufactured. FIG. 16 is a perspective view of the mold 370. As illustrated in FIG. 16, the mold 370 includes a mold body 378 that has a bottomed cylindrical shape, spiral cores 371 to 375 that correspond to the hollow portions 381 to 385 of the molded body 380, and rod cores **376*a* to 376*d* that correspond to the hollow portions 386*a* to 386*d*. The mold 370 has a molding space 377 that has the same shape as the molded body 380. The molding space 377 is a space obtained by removing the cores 371 to 375 and 376*a* to 376*d* from a cylindrical space inside the mold body 378. Lower ends of the spiral cores 371** to

375 are formed into a one-piece together with a bottom surface of the mold body 378. Upper ends of the cores 371 to 375 are secured to a bridge portion 378*a* that extends across an upper portion of the mold body 378 so as to form a cross shape with a holding member interposed therebetween. The mold 370 is manufactured by a known 3D printer described according to the first embodiment.

Steps (b) to (d)

At the step (b), the molded body 380 is manufactured in the mold 370. Here, the molded body 380 is manufactured by mold casting. At the step (c), the mold 370 is removed from a one-piece into which the mold 370 and the molded body 380 are formed, and the molded body 380 is obtained. At the step (d), the molded body 380 is degreased and is subsequently fired, and the plug 350 is manufactured. The steps (b) to (d) are followed in accordance with the steps (b) to (d) according to the first embodiment.

The plug 350 described in detail above includes the branch paths 356*a* to 356*d* that branch from the positions on the first spiral gas flow path 351 in the plug body 358. The branch paths 356*a* are in communication with the second spiral gas flow path 352 and open on the outer circumferential surface of the plug body 358. The branch paths 356*b* are in communication with the third spiral gas flow path 353 and open on the outer circumferential surface of the plug body 358. The branch paths 356*c* are in communication with the fourth spiral gas flow path 354 and open on the outer circumferential surface of the plug body 358. The branch paths 356*d* are in communication with the fifth spiral gas flow path 355 and open on the outer circumferential surface of the plug body 358. The mold 370 that is used when the plug 350 is manufactured includes the spiral cores 371 to 375 that correspond to the first to fifth spiral gas flow paths 351 to 355. The cores 371 and 372 hold each other with the rod cores 376*a* that correspond to the branch paths 356*a* interposed therebetween and are secured to an inner circumferential surface of the mold body 378 with the cores 376*a* interposed therebetween. The cores 371 and 373 hold each other with the rod cores 376*b* that correspond to the branch paths 356*b* interposed therebetween and are secured to the inner circumferential surface of the mold body 378 with the cores 376*b* interposed therebetween. The cores 371 and 374 hold each other with the rod cores 376*c* that correspond to the branch paths 356*c* interposed therebetween and are secured to the inner circumferential surface of the mold body 378 with the cores 376*c* interposed therebetween. The cores 371 and 375 hold each other with the rod cores 376*d* that correspond to the branch paths 356*d* interposed therebetween and are secured to the inner circumferential surface of the mold body 378 with the cores 376*d* interposed therebetween. For this reason, the spiral cores 371 to 375 can be remarkably prevented from being damaged, and the plug 350 can be manufactured with a good yield.

The branch paths 356*a* to 356*d* of the plug 350 branch from the multiple positions on the first spiral gas flow path 351. Consequently, the spiral cores 371 to 375 that are provided in the mold 370 are more effectively prevented from being damaged.

The multiple branch paths 356*a* to 356*d* are equiangularly spaced along the concentric circle of the plug body 358 in a plan view. Consequently, the spiral core 371 that is provided in the mold 370 is stably held by the multiple rod cores 376*a* to 376*d* that are equiangularly spaced in a plan view.

The first to fifth spiral gas flow paths 351 to 355 are adjacent to each other in the plug body 358, and accordingly, the diameters of spirals of the first to fifth spiral gas flow paths 351 to 355 can be relatively freely designed.

According to the fourth embodiment, the number of the spiral gas flow paths is larger than those according to the first to third embodiments, and accordingly, the amount of gas that is supplied to the lower surface of the wafer W can be increased.

Fifth Embodiment

Figure 17:
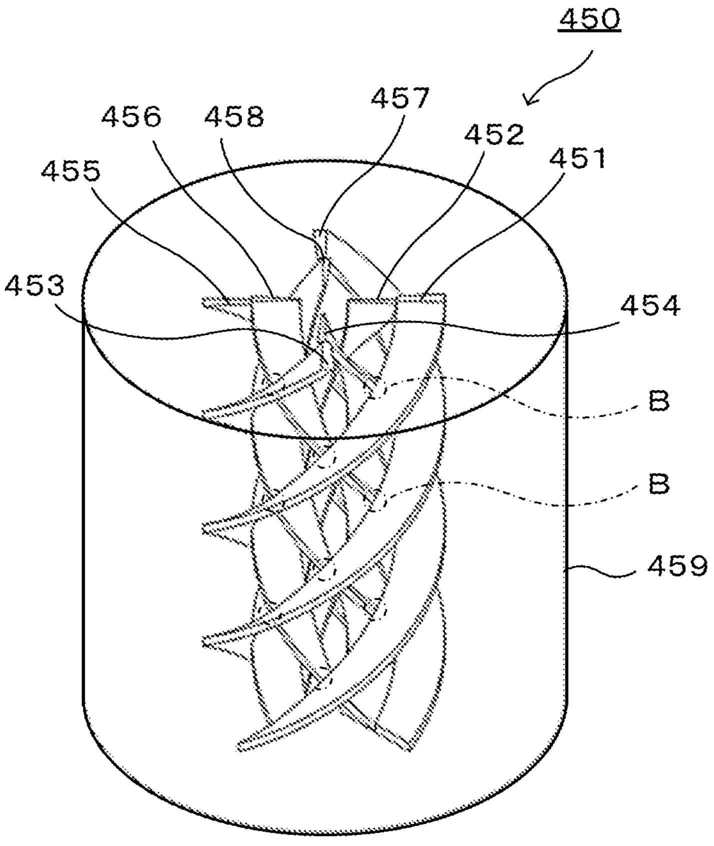
FIG. 17 is a reference perspective view of a plug 450.
Figure 18:
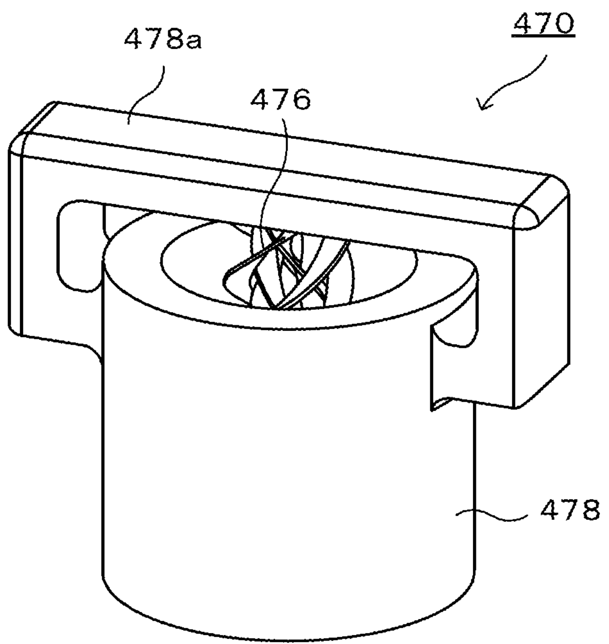
FIG. 18 is a perspective view of a mold 470.

According to a fifth embodiment, plugs 450 are used instead of the plugs 50 according to the first embodiment. For this reason, the plugs 450 will now be described. FIG. 17 is a reference perspective view (a perspective view in which first to first to eighth spiral gas flow paths 451 to 458 and branch paths B that are to be originally represented by using hidden lines (dashed lines) are presented by using solid lines for convenience) of one of the plugs 450. FIG. 18 is a plan view of a mold 470.

The plug 450 is a columnar member. The plug 450 includes a columnar plug body 459 composed of dense ceramic, the first to eighth spiral gas flow paths 451 to 458 that are provided in the plug body 459, and the branch paths B that branch from positions on the first to eighth spiral gas flow paths 451 to 458. For example, the plug body 459 may be composed of the same ceramic material as the ceramic plate 20.

The first to eighth spiral gas flow paths 451 to 458 allow gas to pass therethrough and extend from a lower opening that is provided in a lower surface of the plug body 459 to an upper opening that is provided in an upper surface. The first, third, fifth, and seventh spiral gas flow paths 451, 453, 455, and 457 are obtained by forming flat belt-like flow paths that have a rectangular section downward from above such that the flat belt-like flow paths are spirally wound clockwise. Angles between the first, third, fifth, and seventh spiral gas flow paths 451, 453, 455, and 457 in the circumferential direction are 90°. The second, fourth, sixth, and eighth spiral gas flow paths 452, 454, 456, and 458 are obtained by forming flat belt-like flow paths that have a rectangular section downward from above such that the flat belt-like flow paths are spirally wound counterclockwise. Angles between the second, fourth, sixth, and eighth spiral gas flow paths 452, 454, 456, and 458 in the circumferential direction are 90°. The second, fourth, sixth, and eighth spiral gas flow paths 452, 454, 456, and 458 are surrounded by the first, third, fifth, and seventh spiral gas flow paths 451, 453, 455, and 457. The upper openings of the first, third, fifth, and seventh spiral gas flow paths 451, 453, 455, and 457 are outside the upper openings of the second, fourth, sixth, and eighth spiral gas flow paths 452, 454, 456, and 458 at the upper surface of the plug body 459.

As for the plug 450, the branch paths B (portions illustrated by using circles of one-dot chain lines) correspond to portions at which side surfaces of two spiral gas flow paths of the first to eighth spiral gas flow paths 451 to 458 are in point contact with each other. Specifically, the branch paths B correspond to portions at which an outer side surface of the first spiral gas flow path 451 is in communication with inner side surfaces of the second, fourth, sixth, and eighth spiral gas flow paths 452, 454, 456, and 458, portions at which an outer side surface of the third spiral gas flow path 453 is in communication with inner side surfaces of the second, fourth, sixth, and eighth spiral gas flow paths 452, 454, 456, and 458, portions at which an outer side surface of the fifth spiral gas flow path 455 is in communication with inner side surfaces of the second, fourth, sixth, and eighth spiral gas flow paths 452, 454, 456, and 458, and portions at which an outer side surface of the seventh spiral gas flow path 457 is in communication with inner side surfaces of the second, fourth, sixth, and eighth spiral gas flow paths 452, 454, 456, and 458.

The maximum length Hmax of the first to eighth spiral gas flow paths 451 to 458 and the branch paths B in the up-down direction is preferably 0.5 mm or less. This enables arc discharge to be sufficiently inhibited from occurring in the first to eighth spiral gas flow paths 451 to 458 and the branch paths B.

The plug 450 can be manufactured in accordance with the first to fourth embodiments. Specifically, the mold 470 illustrated in FIG. 18 is prepared. The mold 470 includes a mold body 478 that has a bottomed cylindrical shape and a core 476. The core 476 is an assembly of spiral members that have substantially the same shape as the first to eighth spiral gas flow paths 451 to 458. Two inner and outer spiral members adjacent to each other of the spiral members include portions (portions that are finally to be the branch paths B) at which side surfaces are in contact with each other. A lower end of the core 476 is secured to a bottom surface of the mold body 478, and an upper end thereof is secured to a bridge portion 478*a* that extends across an upper portion of the mold body 478. The mold 470 is manufactured by using a known 3D printer described according to the first embodiment. A molded body (that is to be the plug 450 after firing) is manufactured by using the mold 470, the obtained molded body is degreased and is subsequently fired, and the plug 450 is manufactured.

The plug 450 described in detail above includes the branch paths B that branch from the positions on the first to eighth spiral gas flow paths 451 to 458 in the plug body 459. Each branch path B causes two of the first to eighth spiral gas flow paths 451 to 458 to be in communication with each other. The mold 470 that is used when the plug 450 is manufactured includes the core 476 that is the assembly of the spiral members that correspond to the first to eighth spiral gas flow paths 451 to 458. The spiral members hold each other with portions that correspond to the branch paths B interposed therebetween. For this reason, the core 476 can be prevented from being damaged, and the plug 450 can be manufactured with a good yield.

The branch paths B of the plug 450 branch from the multiple positions on one of the spiral gas flow paths. Consequently, one of the spiral members that are included in the core 476 that is provided in the mold 470 that is used when the plug 450 is manufactured and the other spiral members hold each other at multiple positions, and accordingly, the core 476 is more effectively prevented from being damaged.

The multiple branch paths B may be equiangularly spaced along a concentric circle of the plug body 459 in a plan view. In this case, the spiral members that are included in the core 476 that is provided in the mold 470 are stably held by multiple connection portions that are equiangularly spaced in a plan view.

The first, third, fifth, and seventh spiral gas flow paths 451, 453, 455, and 457 surround the second, fourth, sixth, and eighth spiral gas flow paths 452, 454, 456, and 458. For this reason, regions of the plug body 459 that are surrounded by the first, third, fifth, and seventh spiral gas flow paths 451, 453, 455, and 457 are effectively used, and the second, fourth, sixth, and eighth spiral gas flow paths 452, 454, 456, and 458 can be provided.

The first to eighth spiral gas flow paths 451 to 458 have a rectangular section, and accordingly, the areas of the flow paths are more easily increased than a spiral gas flow path that has a circular section.

The branch paths B substantially correspond to the point-contact portions, and accordingly, the amount of gas that flows through the branch paths B is small. For this reason, collision of the gas is unlikely to occur, and the gas is likely to smoothly flow.

The rotation direction (counterclockwise and downward from above) of the second, fourth, sixth, and eighth spiral gas flow paths 452, 454, 456, and 458 of the plug 450 that are inner spiral gas flow paths is opposite the rotation direction (clockwise and downward from above) of the first, third, fifth, and seventh spiral gas flow paths 451, 453, 455, and 457 of the plug 450 that are outer spiral gas flow paths. For this reason, two spiral members that are included in the core 476 of the mold 470 and that have different rotation directions firmly hold each other at connection points.

Other Embodiments

It is without saying that the present invention is not limited to the embodiments described above and can be carried out in various aspects within the technical scope of the present invention.

For example, according to the first embodiment described above, the branch paths 56 are linearly provided in the horizontal direction but is not particularly limited thereto. For example, the branch paths 56 may be linearly provided upward and obliquely (or downward and obliquely) or the branch paths 56 may not be linear but may curve. The same is true for the second to fourth embodiments.

According to the first embodiment described above, the branch paths 56 branch from the multiple positions on the spiral gas flow path 51 but are not particularly limited thereto. For example, the branch paths 56 are provided on the left-hand and right-hand sides of the spiral gas flow path 51 in FIG. 4 but may be provided on the left-hand side or the right-hand side. The branch paths 56 may be provided at a position on the spiral gas flow path 51. The same is true for the second and third embodiments. According to the fourth embodiment, the branch paths 356*a* to 356*d* are provided at the multiple positions in the up-down direction but may be provided at a position in the up-down direction.

According to the first embodiment described above, the branch paths 56 are provided at an interval of 180° along the concentric circle of the plug body 58 in a plan view but are not limited thereto. For example, the angle may be 120°, 90°, or 60° instead of 180°. The branch paths 56 may not be equiangularly spaced but may be provided at random intervals. The same is true for the second and third embodiments.

According to the first embodiment described above, the insulating pipes 60 are provide, but the insulating pipes 60 may be omitted. A gas channel structure may be provided instead of the gas holes 34 that are provided in the cooling plate 30. The gas channel structure may include a ring portion that is provided in the cooling plate 30 (above the refrigerant flow path 32) and that is concentric with the cooling plate 30 in a plan view, an introduction portion that introduces gas into the ring portion from a back surface of the cooling plate 30, and a distribution portion that distributes gas to the plugs 50 from the ring portion. The number of the introduction portion may be smaller than the number of the distribution portion and may be, for example, 1. The same is true for the second to fourth embodiments.

According to the first embodiment described above, the electrostatic electrode is described as an example of the electrode 22 that is contained in the ceramic plate 20, but this is not a limitation. For example, the ceramic plate 20 may contain a heater electrode (a resistance heating element)

instead of or in addition to the electrode 22 or may contain a RF electrode. The same is true for the second to fourth embodiments.

According to the fourth embodiment described above, the first to fifth spiral gas flow paths 351 to 355 are provided in the plug body 358, but this is not a limitation. For example, one or more and three or less of the second to fifth spiral gas flow paths 352 to 355 in the plug body 358 may be omitted. In this case, a branch path that is connected to the omitted spiral gas flow path may be left or may be omitted.

According to the first to fourth embodiments described above, the sections of the spiral gas flow paths are circular, but this is not a limitation. For example, the sections of the spiral gas flow paths may be elliptical or polygonal (for example, square or rectangular). According to the fifth embodiment described above, the sections of the spiral gas flow paths are rectangular, but this is not a limitation. For example, the sections of the spiral gas flow paths may be circular, elliptical, or polygonal (for example, square).

According to the fifth embodiment described above, the upper opening of the first spiral gas flow path 451 and the upper opening of the second spiral gas flow path 452 are in contact with each other at the upper surface of the plug 450, but this is not a limitation. For example, the upper opening of the first spiral gas flow path 451 and the upper opening of the second spiral gas flow path 452 may be spaced from each other. The same is true for the upper opening of the third spiral gas flow path 453, the upper opening of the fourth spiral gas flow path 454, the upper opening of the fifth spiral gas flow path 455, the upper opening of the sixth spiral gas flow path 456, the upper opening of the seventh spiral gas flow path 457, and the upper opening of the eighth spiral gas flow path 458.

According to the fifth embodiment described above, the first to eighth spiral gas flow paths 451 to 458 are provided, but the number of the spiral gas flow paths may be any number, provided that the number of 2 or more.

The present application claims priority from Japanese Patent Application No. 2022-203899, filed on Dec. 21, 2022, the entire contents of which are incorporated herein by reference.

What is claimed is:

1. A plug comprising:

a plug body;

a spiral gas flow path that is provided in the plug body and that extends from a lower surface of the plug body to an upper surface; and at least one branch path that branches from a position on the spiral gas flow path and that opens on an outer circumferential surface of the plug body or that is in communication with another spiral gas flow path that differs from the spiral gas flow path and that extends from a lower surface of the plug body to an upper surface.

2. The plug according to claim 1, wherein the branch path is in communication with the other spiral gas flow path and opens on the outer circumferential surface of the plug body.

3. The plug according to claim 1, wherein at least one branch path comprises a plurality of branch paths that branch from a plurality of positions on the spiral gas flow path.

4. The plug according to claim 3, wherein the plurality of the branch paths is equiangularly spaced along a concentric circle of the plug body in a plan view.

5. The plug according to claim 1, wherein the branch path is in communication with the other spiral gas flow path, and wherein the spiral gas flow path surrounds the other spiral gas flow path.

6. The plug according to claim 1, wherein the branch path is in communication with the other spiral gas flow path, and wherein the other spiral gas flow path is adjacent to the spiral gas flow path.

7. A method of manufacturing the plug according to claim 1, comprising:

(a) a step of manufacturing a mold by using an organic material, the mold having a molding space that has the same shape as a molded body that is a precursor of the plug, the mold being formed into a one-piece together with a core that corresponds to the spiral gas flow path and the branch path or a core that corresponds to the spiral gas flow path, the other spiral gas flow path, and the branch path;

(b) a step of manufacturing the molded body in the mold by injecting and solidifying a ceramic slurry in the molding space of the mold;

(c) a step of obtaining the molded body by removing the mold from a one-piece of the mold and the molded body; and (d) a step of obtaining the plug by firing the molded body.

8. A member for semiconductor manufacturing apparatus comprising:

a ceramic plate that has an upper surface that includes a wafer placement portion; and the plug according to claim 1 that is installed in a plug installation hole that extends through the ceramic plate in an up-down direction.

* * * * *